(12) United States Patent
Zhu

(10) Patent No.: US 7,897,515 B2
(45) Date of Patent: Mar. 1, 2011

(54) METHOD OF FABRICATING STRUCTURES

(75) Inventor: Jianxin Zhu, Eagan, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 87 days.

(21) Appl. No.: 12/426,332

(22) Filed: Apr. 20, 2009

(65) Prior Publication Data

US 2010/0264500 A1   Oct. 21, 2010

(51) Int. Cl.
*H01L 29/82* (2006.01)
*H01L 21/02* (2006.01)

(52) U.S. Cl. ... 438/694; 438/613; 438/698; 257/E29.323

(58) Field of Classification Search ............. 438/50, 438/613, 694, 698
See application file for complete search history.

(56) References Cited

U.S. PATENT DOCUMENTS

| 6,440,836 | B1* | 8/2002 | Lu et al. | 438/612 |
| 2001/0021541 | A1* | 9/2001 | Akram et al. | 438/106 |
| 2002/0093107 | A1* | 7/2002 | Wu et al. | 257/780 |
| 2002/0175410 | A1* | 11/2002 | Cheng et al. | 257/737 |
| 2003/0155408 | A1* | 8/2003 | Fanti et al. | 228/215 |
| 2008/0157395 | A1* | 7/2008 | Belanger et al. | 257/778 |
| 2008/0206979 | A1* | 8/2008 | Fogel et al. | 438/614 |

OTHER PUBLICATIONS

K.F. Harsh, V.M. Bright and Y.C. Lee, University of Colorado, Boulder "Study of Micro-Sale Limits of Solder Self-Assembly for MEMS", 2000 Electronic Components and Technology Conference.

* cited by examiner

*Primary Examiner* — Alexander G Ghyka
(74) *Attorney, Agent, or Firm* — Campbell Nelson Whipps LLC

(57) ABSTRACT

A method of processing a stack, the method including depositing a fusible material on a first hardmask layer, the first hardmask layer disposed on a surface of a pre-processed stack, the pre-processed stack being disposed on at least a portion of a substrate; heating the fusible material layer to a temperature at or above its melting point to cause it to form a fusible material sphere, the fusible material sphere disposed on less than the entire first hardmask layer; etching the first hardmask layer, wherein the fusible material sphere prevents a portion of the first hardmask layer from etching, thereby forming a second hardmask layer; and etching the pre-processed stack, wherein at least the second hardmask layer prevents a portion of the pre-processed stack from etching, thereby forming a stack.

19 Claims, 8 Drawing Sheets

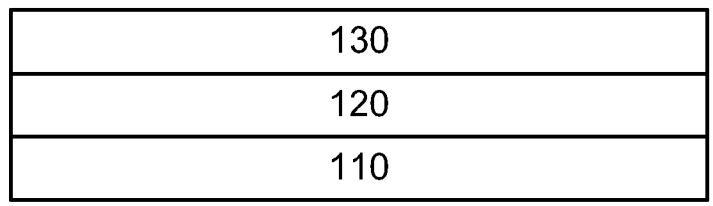
FIG. 1A
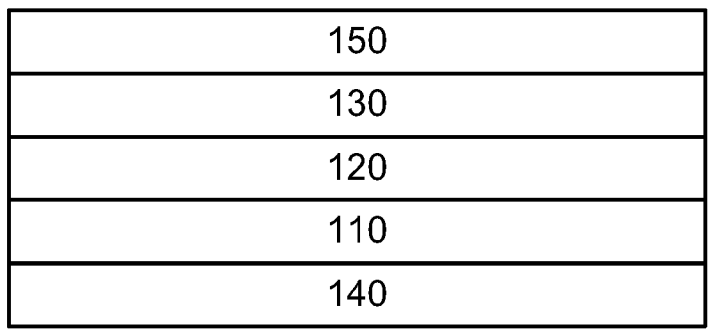
FIG. 1B
FIG. 1C
FIG. 1D

METHOD OF FABRICATING STRUCTURES

BACKGROUND

New types of memory have demonstrated significant potential to compete with commonly utilized types of memory. For example, non-volatile spin-transfer torque random access memory (referred to herein as "STRAM") has been discussed as a "universal" memory. The ability of STRAM to more effectively compete with established memory types, such as FLASH memory (NAND or NOR) can be maximized by either decreasing the current density required by STRAM or by increasing the density at which STRAM cells can be formed on a chip.

Generally, STRAM cells are constructed using photolithographic techniques. Conventional optical lithographic techniques can be described by a factor, K1, that relates to both process parameters and material parameters. K1 can be utilized to calculate the minimum feature size that can be achieved using a photolithographic process with a given set of conditions and materials using Equation 1.

$$CD_{min} = \frac{K_1 \lambda}{NA} \qquad \text{Equation 1}$$

In Equation 1, $CD_{min}$ is the minimum critical dimension that can be obtained with photolithography at the disclosed conditions; $K_1$ is a factor related to materials and processes; $\lambda$ is the wavelength of energy being used in the photolithography; and NA is the numerical aperture of the utilized lens. $K_1$ is typically greater than 0.30 in commonly utilized photolithography processes; as seen from Equation 1, one method of decreasing the minimum feature size that can be fabricated is to decrease $K_1$.

BRIEF SUMMARY

Disclosed herein is a method of processing a stack, the method including depositing a fusible material on a first hardmask layer, the first hardmask layer disposed on a surface of a pre-processed stack, the pre-processed stack being disposed on at least a portion of a substrate; heating the fusible material layer to a temperature at or above its melting point to cause it to form a fusible material sphere, the fusible material sphere disposed on less than the entire first hardmask layer; etching the first hardmask layer, wherein the fusible material sphere prevents a portion of the first hardmask layer from etching, thereby forming a second hardmask layer; and etching the pre-processed stack, wherein at least the second hardmask layer prevents a portion of the pre-processed stack from etching, thereby forming a stack.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 1A through 1D depict MTJ stacks as disclosed herein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 2A:
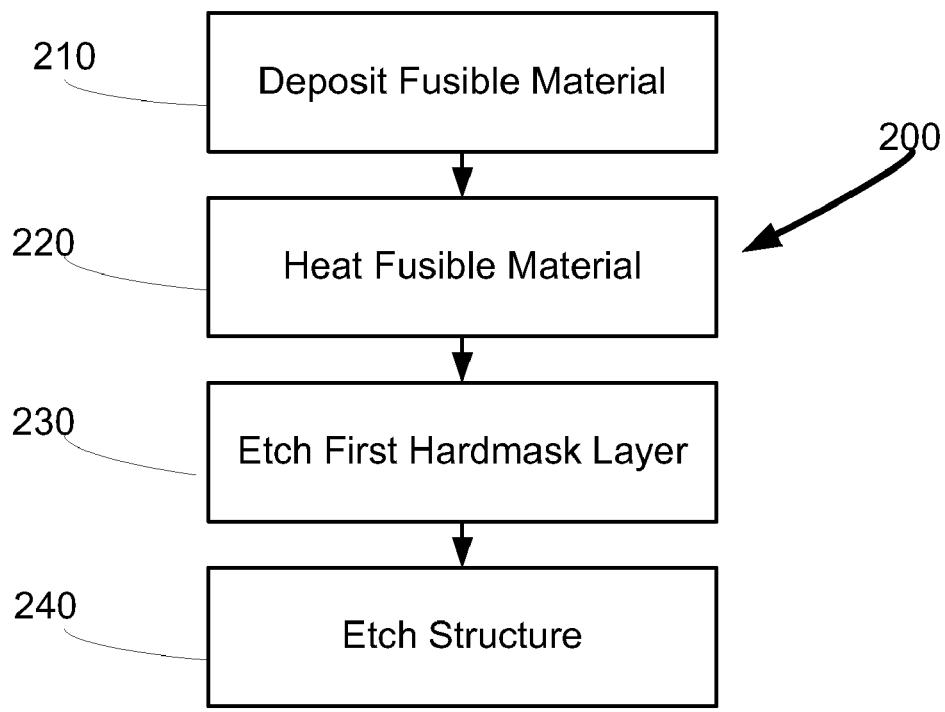
FIGS. 2A and 2B depict a method as disclosed herein.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure provides a method of fabricating structures. In an embodiment, memory cells can be fabricated using methods as disclosed herein. In an embodiment, such structures can have smaller dimensions than previously able to fabricate, thereby allowing for a larger density of structures per area. The methods disclosed herein utilize steps of depositing a fusible material and subsequently heating the fusible material. The fusible material, once heated will form a sphere whose size is dictated at least in part by the thickness of the layer of fusible material and the area covered by the layer. Utilization of this technique along with other small scale fabrication techniques can provide advantageous advances in the size of features that can be reliably fabricated because of the contraction of the surface area of the fusible material upon heating.

Structures that can be formed using methods as disclosed herein include, but are not limited to, electronic components, semiconductor components, or combinations thereof. As used herein, the term "electronic component" also means any device or component that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples include bipolar transistors, field-effect transistors, and integrated circuits. Passive components are electronic components that are static in operation, i.e., are ordinarily incapable of amplification or oscillation, and usually require no power for their characteristic operation. Examples include conventional resistors, capacitors, inductors, diodes, rectifiers and fuses.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators. Examples of semiconductor components include transistors, diodes, some lasers, rectifiers, thyristors and photosensors.

Electronic components contemplated herein may also be classified as power sources or power consumers. Power source components are typically used to power other components, and include batteries, capacitors, coils, and fuel cells. Power consuming components include resistors, transistors, integrated circuits (ICs), sensors, and the like.

Still further, electronic components contemplated herein may also be classified as discreet or integrated. Discreet components are devices that offer one particular electrical property concentrated at one place in a circuit. Examples include resistors, capacitors, diodes, and transistors. Integrated components are combinations of components that that can provide multiple electrical properties at one place in a circuit. Examples include integrated circuits in which multiple components and connecting traces are combined to perform multiple or complex functions such as logic. Electronic components that don't necessarily fall within the above definitions are also contemplated herein.

In an embodiment, methods as disclosed herein can be utilized to fabricate integrated circuits (such as a complementary metal-oxide-semiconductor, referred to as "CMOS") or memory cells. In an embodiment, memory such as resistive changing RAM (RRAM) can be fabricated utilizing methods as disclosed herein. RRAM refers to a memory unit that exhibits at least two resistive states. The at least two resistive states are reversible. Resistive changing RAM includes, for example, magneto-resistive Random Access Memory (MRAM), spin-transfer torque RAM (STRAM), and phase change RAM (PCRAM). In an embodiment, methods as disclosed herein can be utilized to fabricate memory cells that include a magnetic tunnel junction (MTJ). A MTJ generally includes two magnetic electrode layers separated by a thin insulating layer known as a tunnel barrier. An embodiment of a MTJ is depicted in FIG. 1A. The MTJ 100 in FIG. 1A includes a first magnetic layer 110 and a second magnetic layer 130, which are separated by an insulating layer 120. FIG. 1B depicts a MTJ 100 in contact with a first electrode layer 140 and a second electrode layer 150. The first electrode layer 140 and the second electrode layer 150 electrically connect the first magnetic layer 110 and the second magnetic layer 130 respectively to a control circuit providing read and write currents through the magnetic layers. The relative orientation of the magnetization vectors of the first magnetic layer 110 and the second magnetic layer 130 can be determined by the resistance across the MTJ 100.

The first magnetic layer 110 and the second magnetic layer 130 are generally made of ferromagnetic alloys such as iron (Fe), cobalt (Co), and nickel (Ni) alloys. In an embodiment, the first magnetic layer 110 and the second magnetic layer 130 can be made of alloys such as FeMn, NiO, IrMn, PtPdMn, NiMn and TbCo for example. The insulating layer 120 is generally made of an insulating material such as aluminum oxide ($Al_2O_3$) or magnesium oxide (MgO).

The magnetization of one of the magnetic layers, for example the first magnetic layer 110 is generally pinned in a predetermined direction, while the magnetization direction of the other magnetic layer, for example the second magnetic layer 130 is free to rotate under the influence of a spin torque. Pinning of the first magnetic layer 110 may be achieved through, e.g., the use of exchange bias with an antiferromagnetically ordered material such as PtMn, IrMn and others.

Methods of fabricating structures, such as stacks and MTJs are generally known. "Stack" as that phrase is utilized herein generally refers to a structure having more than one layer. An exemplary stack includes, for example, an MTJ as described above. Embodiments of methods described herein can include fabricating a MTJ or can utilize a MTJ that has already been formed and process it further using methods disclosed herein. Generally, MTJs can be fabricated using commonly utilized techniques such as photolithography. In an embodiment, a method as disclosed herein can utilize a pre-processed structure, such as a pre-processed stack or a pre-processed MTJ. A "pre-processed" structure, stack or MTJ is used herein to refer to a structure, stack or MTJ that has only been formed, but not subjected to other steps in methods as disclosed herein. In an embodiment, a pre-processed stack will be larger, i.e. have a larger diameter or larger length or width or both, than a stack that has been subjected to a method as disclosed herein. In an embodiment, a method as disclosed herein can include a step of forming a stack. In an embodiment, a method as disclosed herein can carry out an initial step on a pre-processed stack.

A stack or MTJ is generally disposed on a substrate. FIG. 1C illustrates an exemplary substrate with three MTJs 100 disposed on a substrate 160. It will be understood that three MTJs are illustrative only and more or less than three MTJs on a substrate are contemplated. As illustrated in the exemplary embodiment depicted in FIG. 1C, the MTJs are disposed on at least a portion of the substrate, and need not, but can be, covering the substrate 160 in its entirety. Generally, the MTJ or stack 100 has a bottom surface 103 that is disposed on the substrate 160 and a top surface 105 that is opposite the bottom surface 103.

In an embodiment, a stack can include a hardmask layer on the top surface of the stack. A hardmask layer functions to controllably and reversibly protect the stack from processes that may be carried out on the stack. Hardmask materials that are generally utilized in semiconductor fabrication can be used herein. Exemplary materials that can be used as hardmasks include, but are not limited to, materials that include silicon (Si), aluminum (Al), titanium (Ti) and tantalum (Ta). Exemplary materials that can be used as hardmasks include, but are not limited to, silicon nitride (SiN), silicon oxide ($SiO_2$), aluminum nitride (AlN), titanium nitride (TiN), and tantalum nitride (TaN). Hardmasks can be deposited by commonly utilized methods including but not limited to, sputtering, ion beam deposition and electroplating. Generally, a hardmask layer utilized herein covers the entire top surface 105 of the stack. Methods as disclosed herein can include deposition of a hardmask layer or can begin with a stack that has already had a hardmask layer deposited thereon. A hardmask layer on the surface of a stack (e.g. a pre-processed stack) that covers the entire surface of the stack is referred to herein as a first hardmask layer, as opposed to a second hardmask layer which is utilized to refer to a hardmask layer where a portion of the hardmask layer has been removed leaving a portion of the stack unprotected.

A method 200 as disclosed herein is depicted in FIG. 2A, and includes step 210, depositing a fusible material; step 220, heating the fusible material; step 230, etching a hardmask layer; and step 240, etching a structure.

Step 210 in a method as disclosed herein generally includes depositing a fusible material. A fusible material, as referred to herein is any material that is capable of being made molten by the application of heat. Stated another way, a fusible material will flow above a certain temperature, which can be referred to as the melting point of the fusible material. Generally, the melting point of a fusible material that can be used herein is at or below a temperature that will adversely affect the stack that it is deposited on. Adverse effects can vary depending on the particular structure and material of the stack. In an embodiment, the melting point of a fusible material that can be used herein is at or below a temperature that will change properties (reversible properties, irreversible properties, or both) of one or more layers of a stack.

In an embodiment where the stack is a MTJ, the melting point of a fusible material that can be used herein is at or below a temperature that will affect the magnetization of the pinned layer, which can be referred to as the blocking temperature. One exemplary material that can be used as the pinned layer of a MTJ is FeMn. It has been reported that a FeMn pinned layer can be unpinned at about 150° C. (has a blocking temperature of about 150° C.); therefore in an embodiment where the stack is a MTJ having a FeMn pinned layer, the fusible material has a melting point at or below about 150° C. Another exemplary material that can be used as the pinned layer of a MTJ is IrMn. It has been reported that a IrMn pinned layer can be unpinned at about 225° C.; therefore in an embodiment where the stack is a MTJ having a IrMn pinned layer, the fusible material has a melting point at or below about 225° C.

Exemplary fusible materials include metals and alloys for example. Exemplary metals include indium (In), Bismuth (Bi), Tin (Sn) and their alloys. In an embodiment where indium is utilized, it can be heated to about 200° C. to melt, or reflow the fusible material for example. In an embodiment, fusible alloys (alloys that melt at low temperatures) can be utilized. Exemplary alloys include alloys of tin (Sn), alloys of bismuth (Bi), and alloys of Cadmium (Cd). Exemplary alloys include SnIn alloys, SnBi alloys, SnInAg alloys, SnZnBi alloys, SnZn alloys, SnInAgBi alloys, SnBiAg alloys, SnAgCu alloys, SnAgBiCu alloys, SnAgBiCu alloys, SnAg alloys, SnAgCuSb alloys, SnCu alloys, for example. In an embodiment, In based alloys, which generally have melting temperatures of about 155° C. and above could be utilized as fusible materials.

The fusible material can generally be deposited using commonly utilized techniques for depositing metals and alloys. Exemplary methods include, but are not limited to thermal spray coating techniques such as combustion torch methods, electric arc methods, and plasma sprays; vapor deposition techniques such as ion plating, sputtering and sputtering deposition and laser surface alloying; chemical vapor deposition techniques; and ion beam techniques. In an embodiment, sputtering can be utilized to deposit the fusible material.

An exemplary sputter deposition process includes setting up a gas plasma discharge between two electrodes: a cathode (made of the fusible material to be coated) and an anode substrate. Positively charged gas ions are attracted to and accelerated into the cathode. The impact knocks atoms off the cathode, which impact the anode and are deposited on the substrate. A film forms as atoms adhere to the substrate. Three commonly used techniques for sputtering are widely available: diode plasmas, RF diodes, and magnetron-enhanced sputtering.

The thickness at which the fusible material is deposited can depend at least in part on the technique that is being used to deposit the material, the desired dimensions in the final processed structure, and other factors. The thickness of the fusible material layer will control, at least in part, the size of the fusible material sphere, which is formed from heating the fusible material to or above its melting point. Thinner layers of fusible material will provide smaller fusible material spheres because there will be less fusible material to form the sphere. This in turn can provide smaller $K_1$ values and therefore smaller final dimensions of the structure. In an embodiment, the fusible material layer can have a thickness from about 10 angstroms (Å) to about 1 micrometer (μm). In an embodiment, the fusible material layer can have a thickness from about 10 Å to about 1000 Å. In an embodiment, the fusible material layer can have a thickness from about 10 Å to about 500 Å. In an embodiment, the fusible material layer can have a thickness from about 10 Å to about 100 Å. In an embodiment, the fusible material layer can have a thickness from about 10 Å to about 50 Å. In an embodiment, the fusible material layer can have a thickness from about 10 Å to about 30 Å.

In an embodiment, the fusible material is deposited on the entire exposed surface of the item that is coated. For example, in an embodiment that has one or more stacks disposed on only a portion of the substrate, the fusible material can be deposited on the top surfaces of the stacks (e.g. the hardmask layer formed on top of the stack) and the exposed portions of the substrate (the portions of the substrate without stacks disposed thereon). Such an article is illustrated in FIG. 1D, where the substrate 160 and the stacks 100 are covered with fusible material 170. In an embodiment such as this, the fusible material can be, but need not be removed from the substrate before further steps are carried out. In an embodiment, the fusible material can be selectively removed from the substrate but not be removed from the surface of the pre-processed stack.

As shown in step 220 of FIG. 2A, after the fusible material has been deposited, the fusible material is then heated. Heating the fusible material generally functions to melt the fusible material. Melting the fusible material transforms the fusible material layer into liquid fusible material disposed on the stack. Generally, because of various properties of the fusible material, and the top surface of the stack (whether modified or not) the liquid fusible material will form a sphere on the top surface of the stack. The sphere formed by heating the fusible material is referred to herein as a "fusible material sphere". A fusible material sphere can be a complete or full sphere or less than a complete sphere, i.e. a partial sphere. A complete sphere can generally provide a final stack of smaller dimensions than a partial sphere formed from the same thickness of fusible material.

A fusible material sphere is generally disposed on less than the entire surface of the top of the stack. Stated another way, because the fusible material layer coalesces to form a fusible material sphere, the fusible material sphere will cover less than the entire surface that the fusible material layer covered. This property of the fusible material sphere in comparison to the fusible material layer affects the advantages of methods as disclosed herein. The smaller surface area of the fusible material sphere in comparison to the fusible material layer affords the ability to form smaller features using photolithographic techniques.

Generally, the fusible material or fusible material layer can be heated using known methods. Exemplary heating techniques can include localized heating of the fusible material or heating of the entire article. Exemplary heating techniques include, but are not limited to, infrared (IR) heating, convection heating, and laser reflow. The temperature to which the fusible material has to be heated is dependent on the identity of the fusible material and the melting point thereof. Generally, the fusible material can be heated to a temperature that is at or above the melting point of the fusible material.

Once the fusible material is heated (step 220), the next step, illustrated as step 230 in FIG. 2A, is to etch the first hardmask layer. Etching is a process that removes the uppermost layer (or layers) of an article. This step functions to remove a portion of the first hardmask layer by using the fusible material sphere as a mask. Generally, a mask functions to protect the surface which it covers from chemical processes, such as etching. The step of etching can, but need not, have an effect on the fusible material sphere. In some embodiments, the etching can function to remove none of the fusible material sphere, at least a portion of the fusible material sphere, or the entire fusible material sphere while it is etching the first hardmask layer. Generally, the step of etching the first hardmask layer functions to create the second hardmask layer (the etched first hardmask layer) which functions to protect a smaller portion of the pre-processed stack than the first hardmask layer did, thereby ultimately allowing at least a portion of the pre-processed stack to be removed by etching.

Generally, the processes and materials used to etch the first hardmask layer can depend at least in part on the material that makes up the first hardmask layer, the thickness of the first hardmask layer, the material making up the pre-processed stack, and other factors not discussed herein. Etching can be carried out using chemicals, including both liquids and gases or can be accomplished with non-chemical methods such as an ion mill. Exemplary wet etchants that can be used to etch various materials include, but are not limited to: a mixture of phosphoric acid, acetic acid, nitric acid and water to etch aluminum (Al); a mixture of hydrochloric acid, nitric acid and water to etch indium tin oxide (ITO); a mixture of ceric ammonium nitrate and nitric acid, or hydrochloric acid to etch chromium (Cr); a mixture of sulfuric acid and hydrogen peroxide to etch organic residues and photoresist; a mixture of nitric acid and hydrofluoric acid to etch silicon (Si); hydrofluoric acid or buffered oxide etch (a mixture of ammonium fluoride and hydrofluoric acid) to etch silicon dioxide ($SiO_2$); and phosphoric acid heated to 180° C. to etch silicon nitride ($Si_3N_4$). Exemplary plasma etchants that can be used to etch various materials include, but are not limited to: chlorine gas ($Cl_2$), $CCl_4$, $SiCl_4$ or $BCl_3$ to etch aluminum (Al); $CF_4$ to etch molybdenum (Mo); oxygen gas ($O_2$), ashing, to etch organic residues and photoresist; $CF_4$, $SF_6$, $NF_3$, $Cl_2$, $CCl_2F_2$ to tech silicon (Si); $CF_4$, $SF_6$, $NF_3$ to etch silicon dioxide ($SiO_2$); $CF_4$, $SF_6$, $NF_3$ to etch silicon nitride ($Si_3N_4$); $CF_4$ to etch tantalum (Ta); $BCl_3$ to etch titanium (Ti); and $CF_4$ or $SF_6$ to etch tungsten (W). In an embodiment where the hardmask layer includes silicon dioxide ($SiO_2$), it can be etched using fluorine ($F_2$) gas or an ion mill for example.

After the first hardmask layer has been etched (using the fusible material sphere as a mask), the next step, depicted as step 240 in FIG. 2A includes etching the structure. Generally, etching the structure is accomplished by using the second hardmask layer (the etched first hardmask layer) as a mask. This step generally functions to make the structure, for example the pre-processed stack, smaller. The structure before this step is referred to as the pre-processed structure or the pre-processed stack for example. Once the pre-processed structure has been etched using the second hardmask layer as a mask, the structure is simply referred to as the structure or the stack.

Generally, the processes and materials used to etch the pre-processed structure can depend at least in part on the material that makes up the pre-processed structure, the material that makes up the second hardmask layer, the thickness of the second hardmask layer and other factors not discussed herein. Etching can be carried out using chemicals, including both liquids and gases or can be accomplished with non-chemical methods such as an ion mill. The exemplary chemical etchants discussed above can also be utilized in this step (or any other etching step) as appropriate given the materials to be etched. In an example where the pre-processed structure is a MTJ stack, the pre-processed stack can be etched using a mixture of carbon monoxide (CO) and ammonia ($NH_3$), methanol ($CH_3OH$) or chlorine ($Cl_2$) gas for example.

In embodiments, methods such as that exemplified by FIG. 2A can be carried out on pre-processed structures having a hardmask layer formed thereon to ultimately form a structure or on pre-processed stacks having a hardmask layer formed thereon to ultimately form a stack.

Figure 2B:
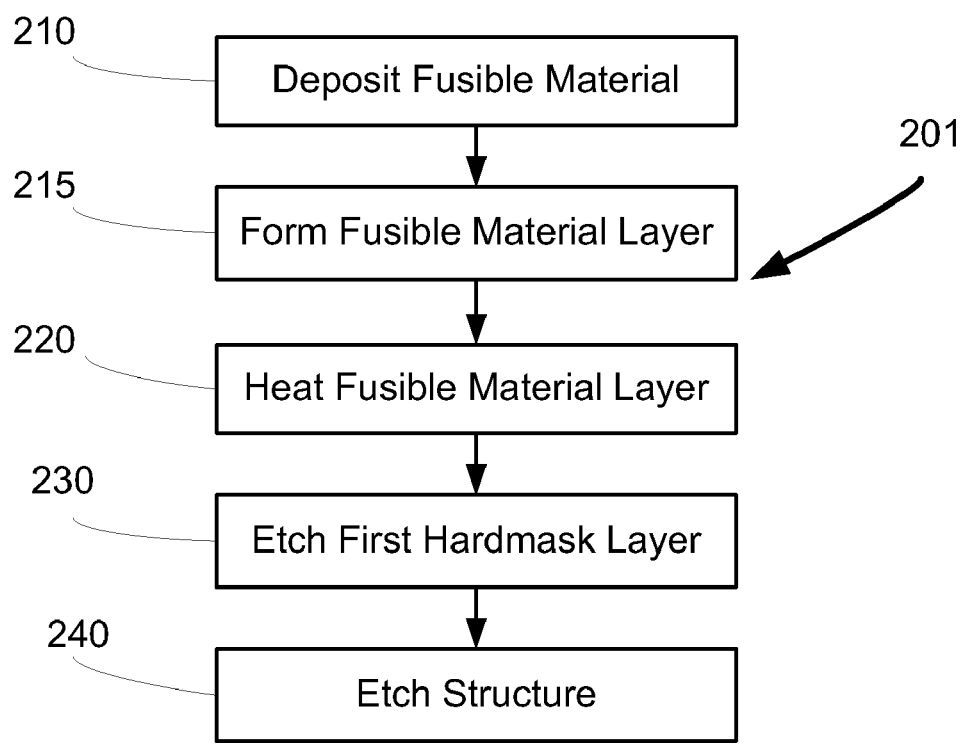

Other exemplary methods can include steps discussed herein or steps not discussed herein carried out before, after, simultaneous with, or at the same time as the steps discussed in methods as disclosed herein. Another exemplary method 201 is depicted in FIG. 2B. The method depicted in FIG. 2B includes step 210, depositing a fusible material (discussed in detail above) followed by step 215, forming a fusible material layer. In some embodiments, the fusible material can be deposited on more surfaces than only the top surfaces of the pre-processed structures. In an embodiment, the fusible material can be deposited on the entire surface of an article (the pre-processed structure or structures, the substrate, and any other structures that may be present). In an embodiment where the fusible material is deposited via sputtering, the fusible material is often deposited on the entire surface of the article, for example the top surfaces of the pre-processed structures and the substrate. In such an embodiment, a portion of the fusible material can, but need not be removed before further steps of a method are undertaken. Removal of a portion of the fusible material to leave fusible material only on the top surfaces of the pre-processed structures can be referred to herein as the step of forming a fusible material layer. It should also be noted that the fusible material on the substrate (for example) can be removed at a different point during a method disclosed herein or can remain on the substrate, i.e. are not removed from the substrate. In an embodiment, fusible material deposited on any surface other than the top surface of the pre-processed structures can be selectively removed.

One method of selectively removing the fusible material from the substrate while not affecting the fusible material disposed on the pre-processed stacks includes use of photoresist techniques. Photoresist, which can either be positive (becomes chemically less stable when exposed to light) or negative (becomes more stable when exposed to light) can be coated onto the entire surface (covering up all of the fusible material) and then only the fusible material on the substrate can be exposed to light (in the case of positive photoresist) using a mask to cover the fusible material on the pre-processed stacks. The photoresist on the substrate fusible material can be developed and then the fusible material on the substrate can be etched while not affecting the fusible material on the pre-processed stacks. The photoresist on the pre-processed stacks can then be removed or stripped before subsequent steps are carried out. Methods as disclosed herein can, but need not include steps of forming a fusible material layer from the fusible material, for example, by using processes to selectively remove portions of the fusible material. The phrase a "fusible material layer" generally refers to non-contiguous deposits of fusible material that are located only on the pre-processed stacks.

Once the fusible material layer has been formed, the fusible material layer is then heated, as depicted by step 220. After the fusible material layer has been heated, the first hardmask layer is etched, step 230, and then the structure, the pre-processed structure is etched, as depicted by step 240. Steps 220, 230 and 240 can be carried out as discussed above.

Figure 3:
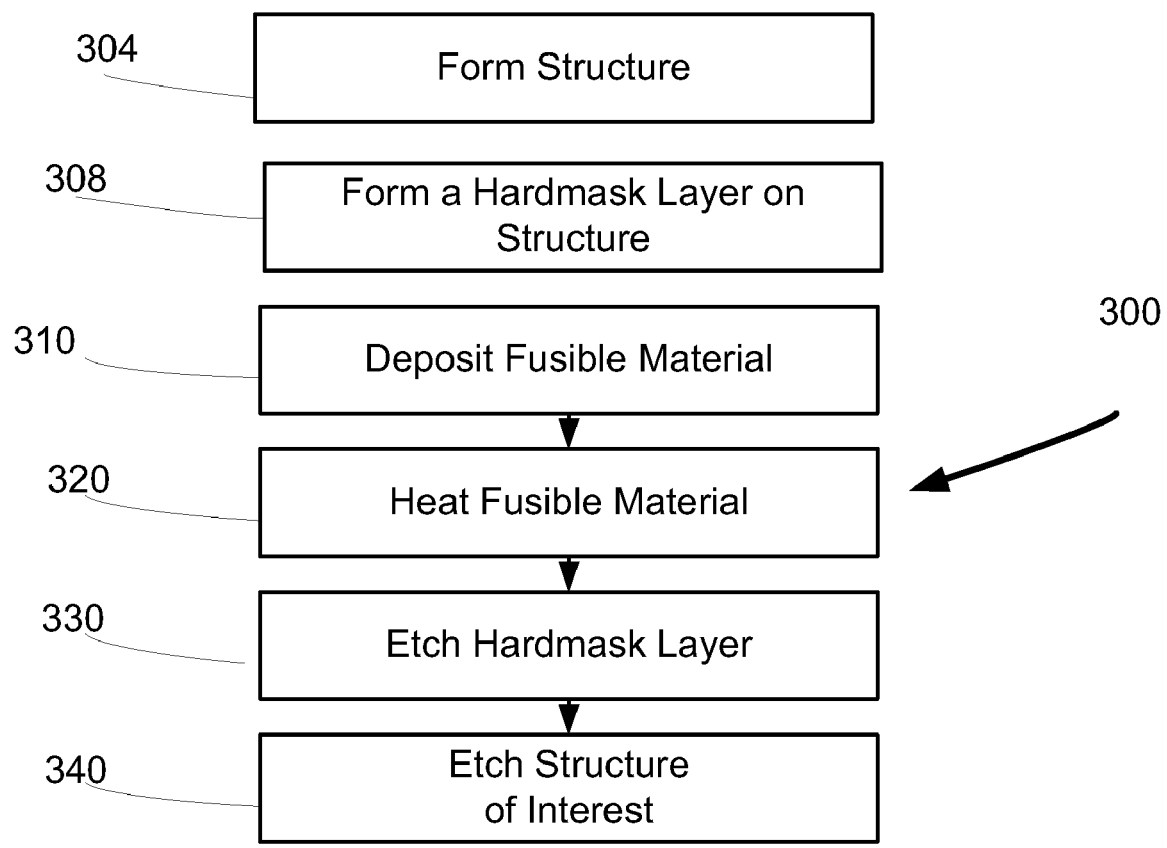
FIG. 3 depicts a method as disclosed herein.

FIG. 3 illustrates another embodiment of a method 300 as disclosed herein. The exemplary method 300 in FIG. 3 begins with step 304, forming a pre-processed structure. Formation of a pre-processed structure can depend in large part on the particular pre-processed structure that is being formed. Commonly utilized methods of forming pre-processed structures can be utilized herein. In an embodiment, the pre-processed structure can be a magnetic tunnel junction (MTJ) that can be used in a memory cell such as a STRAM memory cell. Commonly utilized production processes for the formation of a MTJ can be used herein to form a pre-processed MTJ. The step of forming a pre-processed structure need not, but can be carried out immediately prior to the remaining steps in the method. A pre-processed structure(s) can alternatively be formed at one location and moved to another location, be formed at a different time, or a combination thereof to carry out the remainder of the method.

Figure 4A:
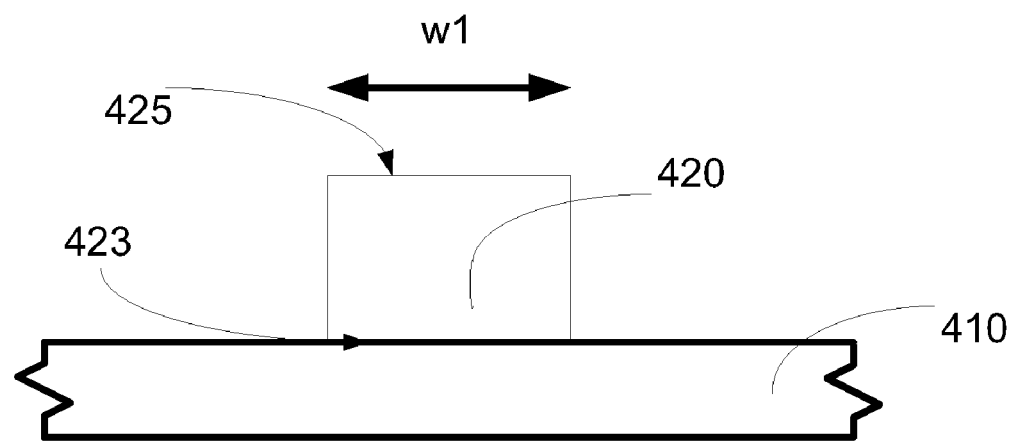
FIG. 4A through 4H depict an article as a method as disclosed herein is carried out.

FIGS. 4A through 4F depict an article being subjected to a method such as that depicted in FIG. 3. The article depicted includes a substrate 410 that includes at least one pre-processed structure 420. The pre-processed structure 420 includes a first surface 423 that is disposed on the substrate 410; and an opposing second surface 425. The first surface 423 can be referred to as the bottom surface and the second surface 425 can be referred to as the top surface. As seen in FIG. 4A, the pre-processed structure 420 has a nominal dimension w1.

The next step in this exemplary method 300 includes step 308, forming a first hardmask layer on the pre-processed structure. This step need not, but can be, carried out immediately prior to the remaining steps in the method. A pre-processed structure(s) can alternatively be formed at one location and moved to another location, be formed at a different time, or a combination thereof to carry out the remainder of the method. For example, once a structure, such as a MTJ for example has a first hardmask layer formed thereon, the structure can withstand various environmental concerns which could afford flexibility in timing and location of carrying out the steps of a method.

As discussed above, materials that can be utilized as hardmask layers can depend at least in part on the materials of the pre-processed structure, the substrate that is utilized, the final application of the structure and other factors not considered herein. Hardmask materials as are generally utilized in semiconductor fabrication (for example) can be used herein. Exemplary materials that can be used in first hardmask layers include, but are not limited to, silicon nitride (SiN), silicon dioxide ($SiO_2$), aluminum oxide ($Al_2O_3$), aluminum nitride (AlN), titanium nitride (TiN), and titanium oxide (TiO).

Generally, a first hardmask layer utilized herein covers the entire top surface of a pre-processed stack. Methods as disclosed herein can include deposition of a first hardmask layer or can begin with a pre-processed stack that has been previously covered with a first hardmask layer. A first hardmask layer on the surface of a pre-processed stack that covers the entire surface of the pre-processed stack is referred to herein as a first hardmask layer, as opposed to a second hardmask layer which is utilized to refer to a hardmask layer where a portion of the hardmask layer has been removed leaving a portion of the pre-processed stack unprotected.

Hardmask layers can be deposited by commonly utilized methods including but not limited to, vapor deposition, sputtering, ion beam deposition, and plating. In an embodiment, formation of a hardmask layer can include deposition of a material followed by further processing to form the hardmask layer. For example, a hardmask material can be deposited on the surface of the substrate and the top surfaces of the pre-processed structures using known techniques (including but not limited to, vapor deposition, sputtering, ion beam deposition, and plating). Then, the deposited hardmask material can be patterned so that it remains only on the top surfaces of the pre-processed structures. This can be carried out for example by application of photoresist, exposure of the photoresist, developing of the photoresist and finally etching of the exposed photoresist (in the case of positive photoresist) to leave the first hardmask layer on the desired portions only. The hardmask material, if deposited on the substrate may, but need not be left on the substrate can be removed at a later time (or alternatively can remain on the substrate).

Figure 4B:
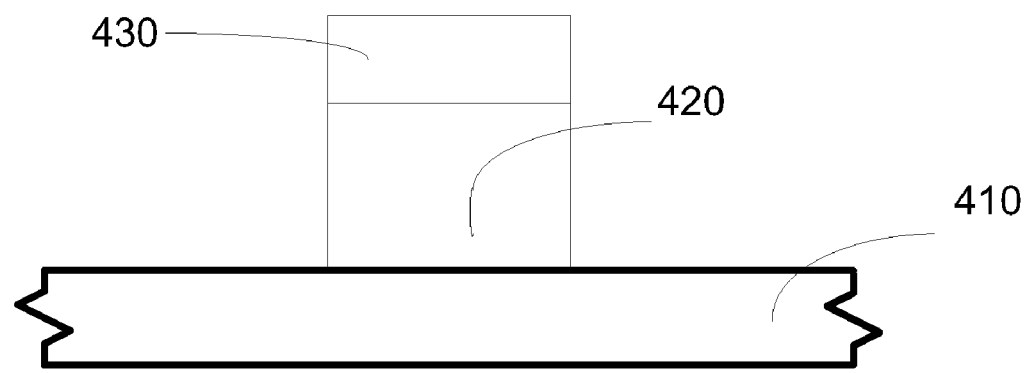

FIG. 4B depicts the article of FIG. 4A after step 308, formation of a first hardmask layer 430 has been carried out. The first hardmask layer 430 is disposed on the second surface 425 of the pre-processed structure 420.

Figure 4C:
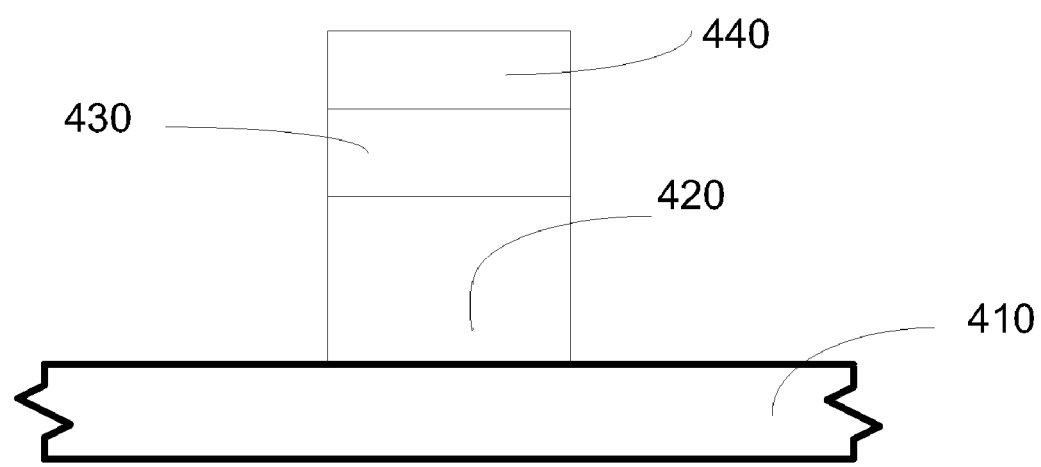

The next step in the exemplary method 300 depicted in FIG. 3 includes the step of depositing the fusible material, step 310. FIG. 4C depicts the article after deposition of a fusible material layer 440. The fusible material layer 440 (or fusible material) is disposed on the first hardmask layer 430.

Figure 4D:
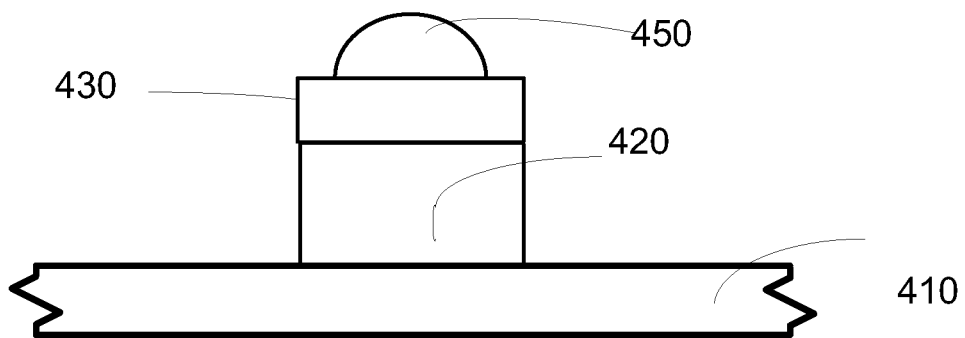

The next step in the exemplary method 300 is step 320, the step of heating the fusible material. Step 320, heating the fusible material can be carried out as discussed above. FIG. 4D depicts the article after the fusible material layer 440 is heated at or above the melting point of the fusible material. As seen in FIG. 4D, the fusible material making up the fusible material layer 440 melts and forms a fusible material sphere 450. The fusible material sphere 450 depicted in FIG. 4D is a partial sphere (although as noted above, full spheres or spheres that are even more partial that that depicted can also be formed) As seen in FIG. 4D, the fusible material sphere 450 is disposed on only a portion of the first hardmask layer 430.

Figure 4E:
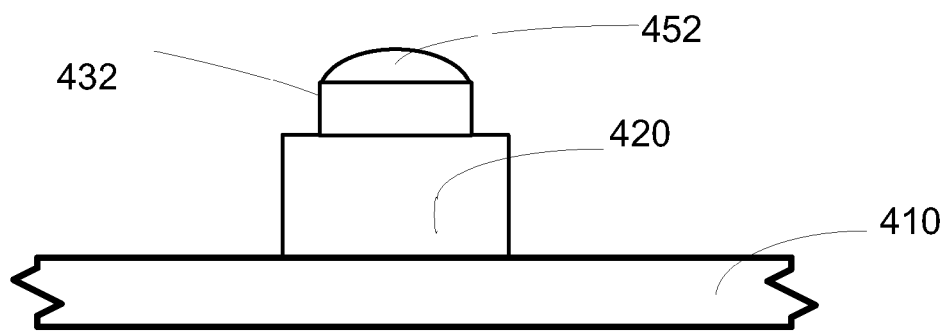

The next step in the exemplary method 300 is step 330, the step of etching the hardmask layer. Step 330, etching the hardmask layer can be carried out as discussed above. FIG. 4E depicts the article after the first hardmask layer 430 has been etched using the fusible material sphere 450 as a mask. As seen in FIG. 4E, this etching step causes a portion of the first hardmask layer 430 to be removed, thereby forming a second hardmask layer 432. FIG. 4E also depicts the possibility that the step of etching the first hardmask layer 430 to form the second hardmask layer 432 can cause a portion of the fusible material sphere 450 to etch, forming what is referred to herein as a partially etched fusible material sphere 452.

Figure 4F:
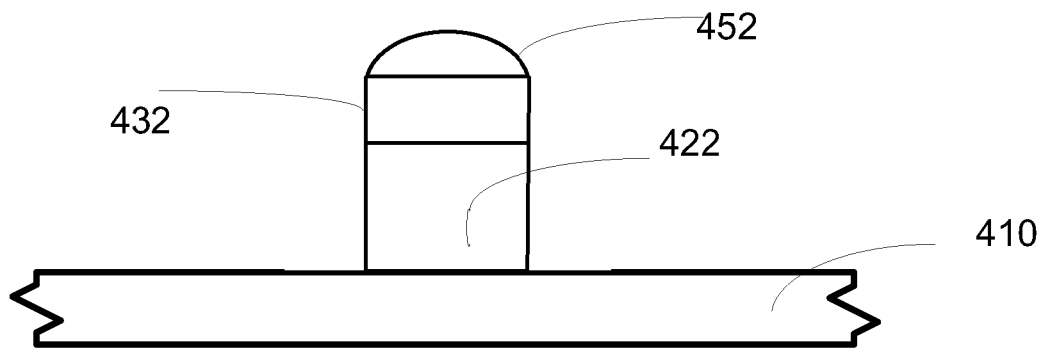

The next step in the exemplary method 300 is step 340, the step of etching the pre-processed structure. Step 340, etching the pre-processed structure can be carried out as discussed above. FIG. 4F depicts the article after the pre-processed stack 420 has been etched using the second hardmask layer 432 and the partially etched fusible material sphere 452 (if present) as a mask. As seen in FIG. 4F, this etching step causes a portion of the pre-processed stack 420 to be removed, thereby forming a stack 422.

Figure 4G:
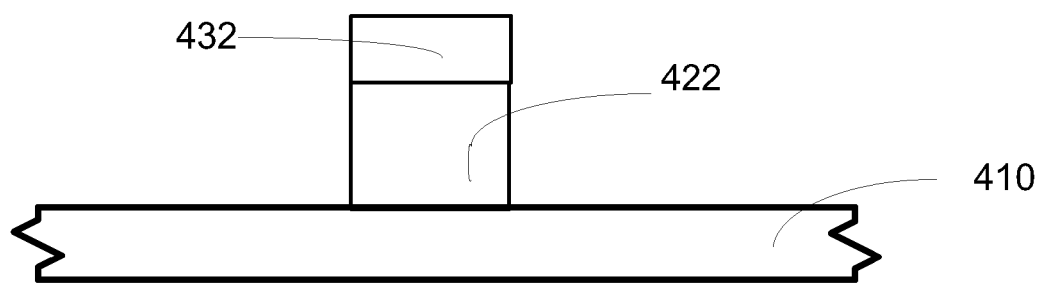
Figure 4H:
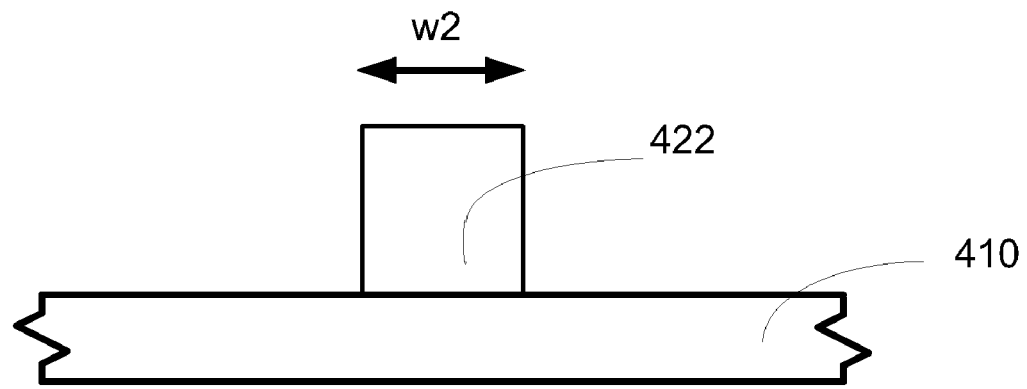

FIG. 4G depicts the article after an optional step of removing the once etched fusible material sphere 452 leaving only the stack 422 with the second hardmask layer 432. FIG. 4H depicts the article after another optional step of removing the second hardmask layer 432 leaving only the stack 422.

As seen in FIG. 4H, the stack 422 has a nominal dimension w2, with w2 being less than the nominal dimension of the pre-processed stack 420, w1. The difference in the nominal dimensions w1 and w2 is due at least in part to the size of the fusible material sphere 450, and whether or not it is a complete sphere or a partial sphere. Generally, smaller fusible material spheres (which can generally be formed by utilizing thinner fusible material layers or thinner layers of fusible material) will afford a larger difference between w1 and w2. Generally, fusible material spheres that are complete spheres will afford a larger difference between w1 and w2 than partial spheres will.

Figure 5:
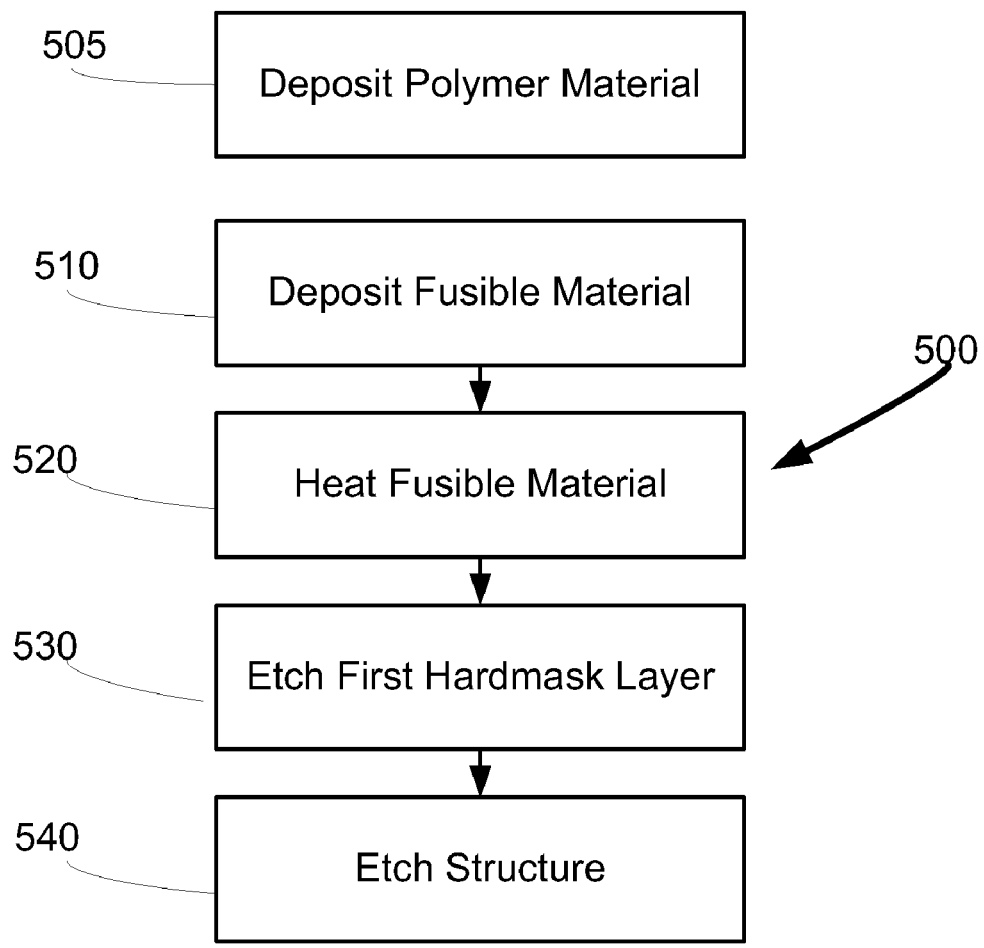
FIG. 5 depicts a method as disclosed herein.

FIG. 5 depicts another exemplary embodiment of a method 500 as disclosed herein. The method 500 depicted in FIG. 5 includes step 505, depositing a polymer material. Generally, the polymer material can be deposited on at least the pre-processed structure(s). The polymer material generally functions to modify the interactions between the fusible material sphere and the pre-processed stack (e.g. via the first hardmask layer). For example, the interactions can be modified by increasing the attraction between the fusible material and the pre-processed stack (via the polymer layer) to more easily retain the fusible material sphere on the pre-processed stack. The attraction between the fusible material sphere and the polymer layer can also determine, at least in part, whether the fusible material sphere will be a complete or partial sphere, for example. The polymer material can also function in a physical fashion to retain the fusible material sphere on the second surface of the pre-processed structure once the fusible material has been heated to form the fusible material sphere.

Generally, the polymer material can include any polymer that has a glass transition temperature (Tg) at or below the melting point of the fusible material. The glass transition temperature of a material is the temperature at which the material changes from a brittle vitreous state to a plastic state. When a polymer material is disposed on a pre-processed structure and heated at or above the glass transition temperature, while the fusible material is simultaneously being melted, the polymer material may be plasticized and thereby form a stabilizing structure around the fusible material sphere that is ultimately formed by melting the fusible material. This stabilizing structure around the fusible material sphere can minimize the possibility of the fusible material sphere from rolling off of the second surface of the pre-processed structure, can center the fusible material sphere on the second surface of the pre-processed structure, or a combination thereof.

The polymer material can also function to increase the adhesion of the fusible material sphere to the second surface of the pre-processed structure because the polymer material will generally have a better adhesion to the second surface of the pre-processed structure than the fusible material sphere will. The polymer material, due to chemical interactions (e.g. hydrophobic or hydrophilic forces) can also play a role in the fusible material sphere being a full or a partial sphere. Polymer materials that can hydrogen bond (for example) with the fusible material can cause the fusible material sphere to be a partial sphere because the fusible material will be somewhat attracted to the polymer material instead of itself. In contrast, polymer materials that cannot hydrogen bond (for example) with the fusible material can cause the fusible material sphere to be closer to a complete sphere because the fusible material would rather interact with itself than the polymer material. However, such repulsive interactions can also make it more difficult to retain the fusible material sphere on the pre-processed stack. Therefore, the desire to have a complete sphere may need to be balanced with the desire to retain the fusible material sphere on the surface of the pre-processed stack.

As discussed above, any polymer material having a Tg that is at or below the melting point of the fusible material can be utilized. In an embodiment, the Tg of the polymer material will not be significantly below the melting point of the fusible material so that the polymer material does not liquefy upon heating, but only agglomerates. In an embodiment, a polymer material that can be utilized will have a Tg that is at or below about 200° C. In an embodiment, a polymer material that can be utilized will have a Tg that is between about 140° C. to about 200° C. Exemplary polymer materials that can be utilized include, but are not limited to, novolac-based polymers, polymethylgultarimide (PMGI), and polymethylmethacrylate (PMMA). In an embodiment, a polymer material that can be utilized includes novolac-based polymer such as those utilized as photoresist.

Generally, the polymer material can be deposited on the pre-processed stack, i.e. the first hardmask layer, using generally utilized methods. Exemplary methods include, but are not limited to, deposition processes such as spin coating and curing. Generally, the thickness of the polymer material can be one that effectively maintains the fusible material sphere on the second surface of the pre-processed structure, provides adhesive properties between the pre-processed structure and the fusible material sphere, or a combination thereof. In an embodiment, the polymer material can have a thickness of about 0.1 micrometers (μm) to about 1 micrometers (μm).

Figure 6A:
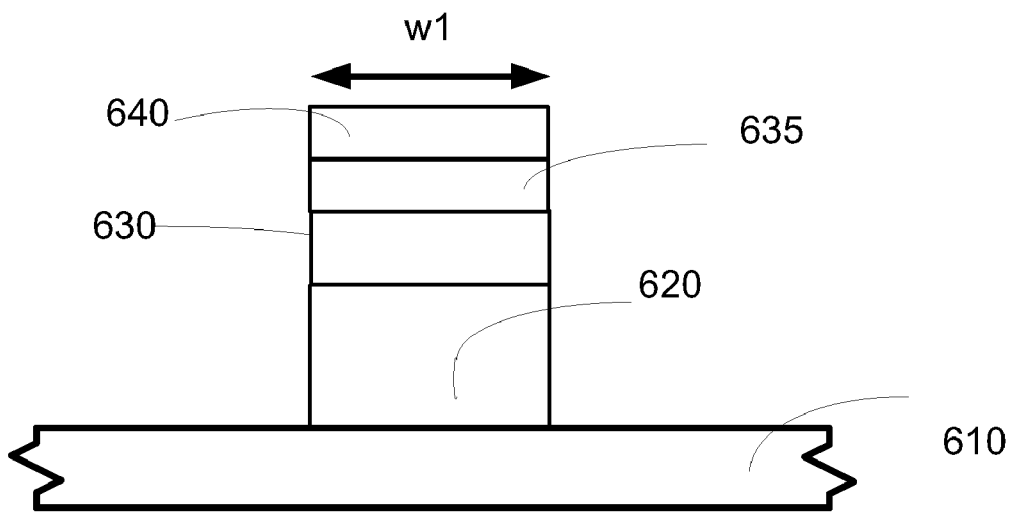
FIG. 6A through 6E depict an article as a method as disclosed herein is carried out.

The next step in the exemplary method 500 depicted in FIG. 5 includes step 510, the step of depositing a fusible material. Step 510, depositing a fusible material can be carried out as discussed above. FIGS. 6A through 6D depict an article being subjected to a method such as that disclosed in FIG. 5. The article depicted in FIG. 6A includes a substrate 610 on which a pre-processed stack 620 is disposed. As seen in FIG. 6A, the pre-processed stack 620 has a nominal dimension w1. The pre-processed stack 620 includes on its second surface (the surface opposite the one disposed on the substrate) a first hardmask layer 630, a polymer material 635 disposed on the first hardmask layer 630 and a fusible material layer 640 disposed on the polymer material 635.

Figure 6B:
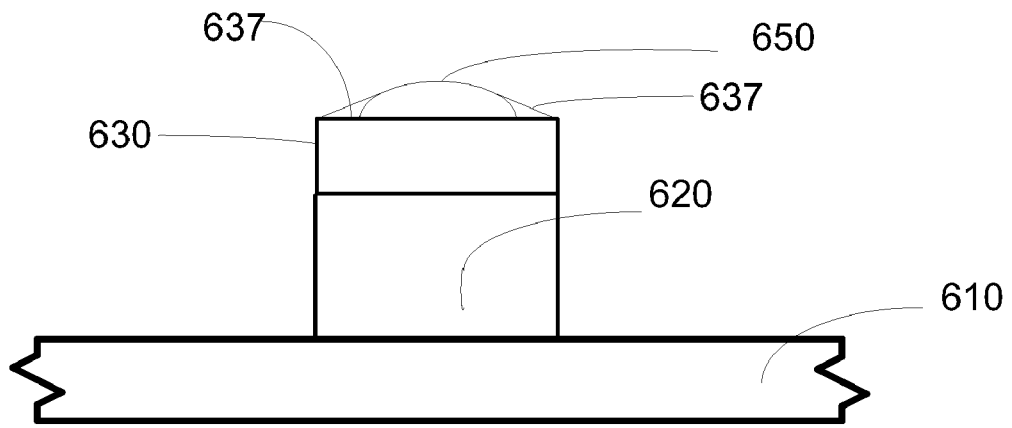

The next step in the exemplary method 500 is step 520, the step of heating the fusible material. Step 520, heating the fusible material can be carried out as discussed above. FIG. 6B illustrates the article after the step of heating the fusible material. As seen in FIG. 6B, heating the fusible material causes formation of a fusible material sphere 650 and changes the polymer material layer 635 into a polymer structure 637. The illustration of the polymer structure 637 as encompassing the fusible material sphere 650 is only an illustration and should in no way be taken as limiting the structure or function of the polymer structure. The polymer structure 637, although not depicted as such in FIG. 6B can remain under the fusible material sphere, around the fusible material sphere, on the surface of the fusible material sphere, amongst the fusible material sphere, or some combination thereof.

Figure 6C:
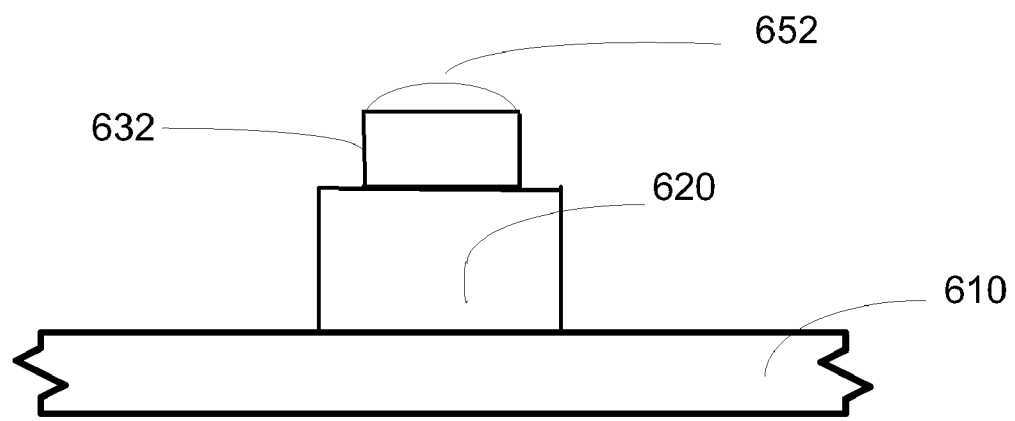

The next step in the exemplary method 500 is step 530, the step of etching the first hardmask layer. Step 530, etching the first hardmask layer can be carried out as discussed above. FIG. 6C illustrates the article after the next step, etching the first hardmask layer 630. As seen in FIG. 6C the polymer structure 637 does not function as a mask for the first hardmask layer 630, while the fusible material sphere 650 does; thereby causing the portions of the first hardmask layer 630 not covered by the fusible material sphere 650 to be etched away forming the second hardmask layer 632. The embodiment illustrated in FIG. 6C shows the step of etching the first hardmask layer 630 as also removing the polymer structure 637. The step of etching the first hardmask layer 630 can function to remove all of the polymer structure 637, a portion of the polymer structure 637 or no portion of the polymer structure 637. In embodiments where etching the first hardmask layer 630 does not remove any of the polymer structure 637 further optional steps (e.g. use of other etchants) can be taken to remove the polymer structure 637. Etching the first hardmask layer 630 can also affect the fusible material sphere 650 forming a partially etched fusible material sphere 652.

Figure 6D:
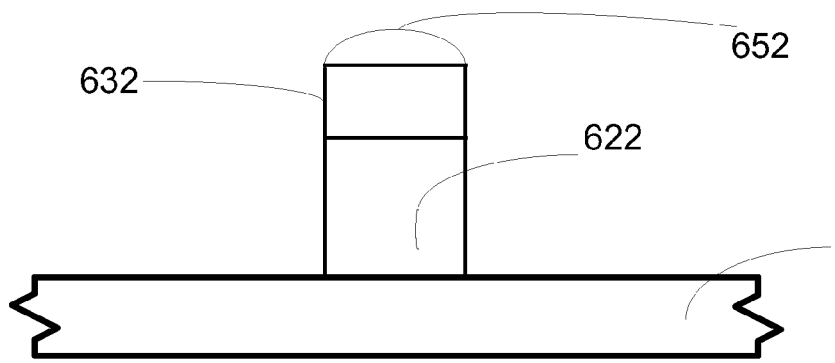

The next step in the exemplary method 500 is step 540, the step of etching the pre-processed structure. Step 540, etching the pre-processed structure can be carried out as discussed above. FIG. 6D shows the article after etching the pre-processed stack 620 to form the stack 622 using the second hardmask layer 632 and the partially etched fusible material sphere 652 (if present) as a mask. As seen in FIG. 6D, this etching step causes a portion of the pre-processed stack 620 to be removed, thereby forming a stack 622.

Figure 6E:
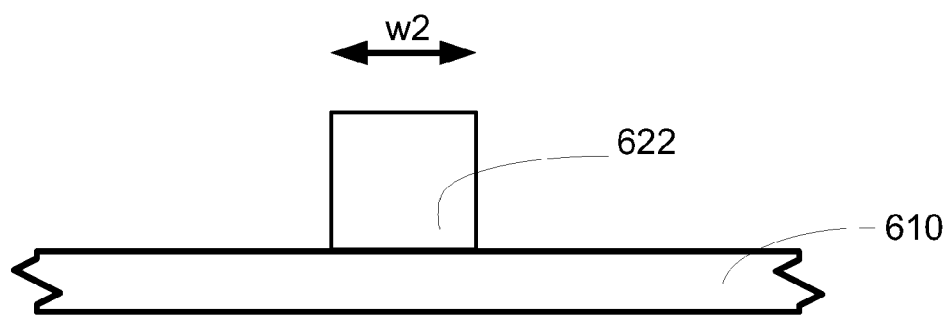

FIG. 6E depicts the article after an optional step or steps of removing the once etched fusible material sphere 652 and the second hardmask layer 632 leaving only the stack 622. As seen in FIG. 6E, the stack 622 has a nominal dimension w2, with w2 being less than the nominal dimension of the pre-processed structure 620, w1. The relationship of w2 to w1 can be controlled as discussed above.

Figure 7:
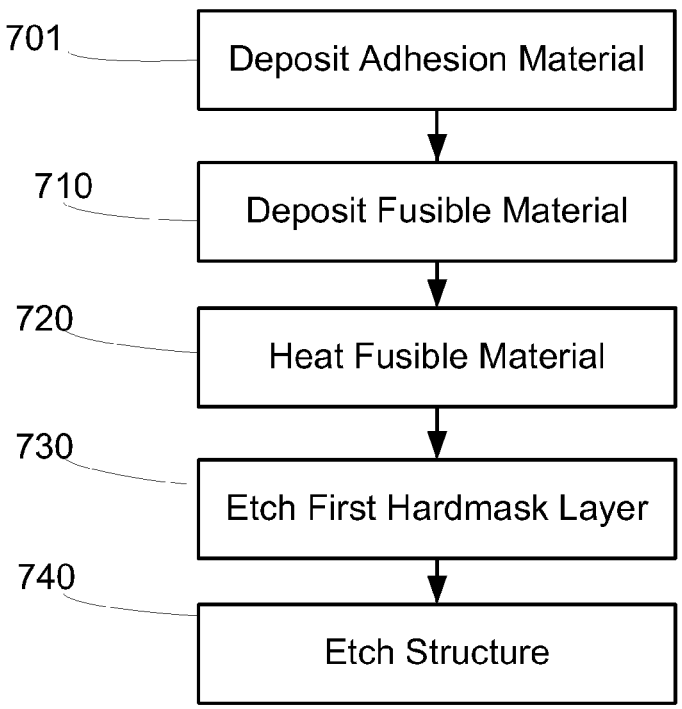
FIG. 7 depicts a method as disclosed herein.

Another exemplary method is depicted in FIG. 7. The method depicted in FIG. 7 includes an initial step 701, of depositing an adhesion material on the pre-processed stack. The adhesion material can have properties that are chosen to be one that can aid in adhering the fusible material, fusible material sphere, or both to the pre-processed stack. Properties of materials that may be relevant to choice of materials for an adhesion layer can include, but are not limited to, the hydrophilic or hydrophobic nature of the proposed adhesion material, the hydrophilic or hydrophobic nature of the second surface of the pre-processed stack or uppermost layer (such as the first hardmask layer) disposed on the pre-processed stack and the hydrophilic or hydrophobic nature of the fusible material. In an embodiment, the adhesion material can be a dielectric material. The adhesion material can cause the fusible material to adhere to the pre-processed stack or uppermost surface of the pre-processed stack, can aid in depositing the fusible material on the pre-processed stack or uppermost surface of the pre-processed stack, can aid in maintaining the fusible material sphere on the pre-processed stack or uppermost surface of the pre-processed stack, or some combination thereof.

Exemplary materials that can be utilized for the adhesion material include, but are not limited to, aluminum oxide ($Al_2O_3$), tantalum oxide ($Ta_2O_5$) and silicon dioxide ($SiO_2$). In an embodiment, a material that can be utilized for the adhesion material includes tantalum oxide ($Ta_2O_5$) and silicon dioxide ($SiO_2$).

Generally, the adhesion material can be deposited on the pre-processed stack using generally utilized methods. Exemplary methods include, but are not limited to, vapor deposition processes such as chemical vapor deposition, sputtering, and ion beam deposition. Generally, the thickness of the adhesion material can be one that effectively maintains the fusible material sphere on the second surface of the pre-processed structure, provides adhesive properties between the pre-processed structure and the fusible material sphere, or a combination thereof. In an embodiment, the adhesion material can have a thickness of about 1 nanometers (nm) to about 100 nanometers (nm).

The remaining steps in the method depicted in FIG. 7 can have similar functions and can be carried out as discussed above.

Thus, embodiments of METHODS OF FABRICATING STRUCTURES are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A method of processing a stack comprising:
    depositing a fusible material on a first hardmask layer, the first hardmask layer disposed on a surface of a pre-processed stack, the pre-processed stack being disposed on at least a portion of a substrate;
    heating the fusible material to a temperature at or above its melting point to cause it to form a fusible material sphere, the fusible material sphere disposed on less than the entire first hardmask layer;
    etching the first hardmask layer, wherein the fusible material sphere prevents a portion of the first hardmask layer from etching, thereby forming a second hardmask layer; and
    etching the pre-processed stack, wherein at least the second hardmask layer prevents a portion of the pre-processed stack from etching, thereby forming a stack.

2. The method according to claim 1, wherein the fusible material is an indium alloy.

3. The method according to claim 1, wherein the fusible material is deposited by sputtering.

4. The method according to claim 1, wherein the fusible material sphere is also deposited on the substrate.

5. The method according to claim 1 further comprising removing the fusible material from the substrate before the fusible material is heated.

6. The method according to claim 1 further comprising forming a polymer layer on the surface of the first hardmask layer before depositing the fusible material.

7. The method according to claim 6, wherein the polymer has a glass transition temperature that is at or below the melting point of the fusible material.

8. The method according to claim 1 further comprising forming an adhesion layer on the surface of the first hardmask layer before depositing the fusible material.

9. A method of processing a stack comprising:
    forming a pre-processed stack on at least a portion of a substrate, the pre-processed stack having a bottom surface in contact with the substrate and a top surface opposite the bottom surface;
    forming a first hardmask layer on the top surface of the pre-processed stack;
    forming a fusible material layer on the surface of the first hardmask layer;
    heating the fusible material layer to a temperature at or above its melting point to cause it to form a fusible material sphere;

etching the first hardmask layer, wherein the fusible material sphere prevents a portion of the first hardmask layer from etching, thereby forming a second hardmask layer; and etching the pre-processed stack, wherein at least the fusible material sphere prevents a portion of the pre-processed stack from etching, thereby forming a stack.

10. The method according to claim 9, wherein the fusible material has a melting point at or below a temperature that will affect the pre-processed stack.

11. The method according to claim 9, wherein the fusible material is an indium alloy.

12. The method according to claim 9, wherein the fusible material layer is formed by sputtering.

13. The method according to claim 12, wherein the fusible material layer is formed on the surface of the first hardmask layer and the surface of the substrate.

14. The method according to claim 13, wherein the fusible material layer on the first hardmask layer is protected by application of a photoresist and the fusible material layer is removed from the substrate by etching.

15. The method according to claim 9, wherein the fusible material sphere is at least a partial sphere.

16. The method according to claim 9, wherein the fusible material sphere is a full sphere.

17. The method according to claim 9 further comprising depositing a polymer on the surface of the first hardmask layer before forming the fusible material layer.

18. The method according to claim 17, wherein the polymer has a glass transition temperature that is at or below the melting point of the fusible material.

19. The method according to claim 9 further comprising forming an adhesion layer on the surface of the first hardmask layer before forming the fusible material layer.

* * * * *